United States Patent
Chiang

(10) Patent No.: US 7,644,329 B2
(45) Date of Patent: Jan. 5, 2010

(54) INTEGRATED CIRCUIT TESTING METHOD AND RELATED CIRCUIT THEREOF

(75) Inventor: Chung-Hsin Chiang, Taipei (TW)

(73) Assignee: ALI Corporation, Taipei (TW)

( * ) Notice: Subject to any disclaimer, the term of this patent is extended or adjusted under 35 U.S.C. 154(b) by 248 days.

(21) Appl. No.: 11/853,023

(22) Filed: Sep. 11, 2007

(65) Prior Publication Data

US 2009/0070645 A1    Mar. 12, 2009

(51) Int. Cl.
    *G01R 31/28* (2006.01)
(52) U.S. Cl. ..................................... 714/729
(58) Field of Classification Search ................. 714/726, 714/729
    See application file for complete search history.

(56) References Cited

U.S. PATENT DOCUMENTS 7,139,950 B2 * 11/2006 Huisman et al. ............ 714/726
7,343,536 B2 * 3/2008 Han ............................ 714/726
7,487,419 B2 * 2/2009 Mukherjee et al. .......... 714/729
2007/0150781 A1 * 6/2007 Chen et al. .................. 714/726
2007/0168799 A1 * 7/2007 Paglieri ....................... 714/726
2007/0234157 A1 * 10/2007 Rajski et al. ................ 714/728

* cited by examiner

*Primary Examiner*—James C Kerveros
(74) *Attorney, Agent, or Firm*—Winston Hsu

(57) ABSTRACT

A chip with an integrated circuit testing function includes a selecting unit positioned before a flip-flop of a scan chain, where the scan chain connects a scan-in pad, a scan-out pad and the flip-flop. When the chip is packaged and the scan-in pad does not connect to a pin of a package, the selecting unit selects a scan-in signal from another scan chain and transmits the scan-in signal from the another scan chain to the flip-flop; and when the chip is packaged and the scan-in pad connects to a pin of the package, the selecting unit selects a scan-in signal from the scan-in pad and transmits the scan-in signal from the scan-in pad to the flip-flop.

6 Claims, 4 Drawing Sheets

INTEGRATED CIRCUIT TESTING METHOD AND RELATED CIRCUIT THEREOF

BACKGROUND OF THE INVENTION

1. Field of the Invention

The present invention relates to testing an integrated circuit, and more particularly, to an integrated circuit testing method and related circuit utilizing different scan chains at different test stages.

2. Description of the Prior Art

To test faults generated during an integrated circuit manufacturing process, scan chains are generally introduced for testing the integrated circuit. Each scan chain connects two pads and at least one flip-flop in the chip, and the testing time of the scan chain is proportional to a length of the scan chain, where the length of the scan chain indicates a number of the flip-flops on the scan chain. Therefore, the number of the flip-flops on the scan chain needs to be reduced to save testing time.

The number of flip-flops in chips with the same design is fixed, and therefore, to save the testing time, the number of scan chains on a chip is designed to be as many as possible. The more the scan chains implemented, the fewer flip-flops are included in each scan chain.

In a prior art method utilizing scan chains to test the integrated circuit, however, because of the limited number of pins after the chip is packaged, the number of pads in the chip that are available for testing the chip is equal to the number of pins that are available for testing the chip. FIG. 1 is a diagram illustrating prior art functions of the pads in the chip 130 and the pins in the package 100. As shown in FIG. 1, a package 100 comprises a chip 130 and a plurality of pins. These pins comprise: three pins 112 for receiving controlling signals; six pins 114 for receiving test scan-in signals; six pins 116 serving as test scan-out nodes; and an unused pin 118. The chip 130 further comprises: three pads 132 for receiving the controlling signals; six scan-in pads 134 for receiving the scan-in signals; six scan-out pads 136 serving as the test scan-out nodes; and a plurality of unused pads 138.

As shown in FIG. 1, each pin in the package 100 connects to its corresponding pad in the chip 130, and each scan-in pad 134 connects to its corresponding scan-out pad 136 through a plurality of flip-flops in the chip 130 to generate a scan chain. For example, a scan-in pad 134_1 connects to a scan-out pad 136_1 through flip-flops to generate a first scan chain; a scan-in pad 134_2 connects to a scan-out pad 136_2 through flip-flops to generate a second scan chain . . . etc. Therefore, in this prior art package 100, six scan chains are generated.

Generally, a chip could be packaged into several different packages, and the number of scan chains is determined by the package with least pins. Therefore, taking the package 100 shown in FIG. 1 as an exemplary package with the least pins, nine unused pads 138 are wasted and cannot be used to generate the scan chains. Then, on average, each scan chain shown in FIG. 1 must have more flip-flops. Therefore, in the test before the chip is packaged or when the chip is packaged in the package with more pins than the package 100, many pads and pins are wasted, resulting in longer test times.

SUMMARY OF THE INVENTION

It is therefore one of the objectives of the claimed invention to provide an integrated circuit testing method and related circuit utilizing different scan chains at different test stages, to solve the above-mentioned problems.

According to one embodiment of the claimed invention, an integrated circuit testing method comprises: respectively connecting a plurality of pads in a chip to generate a plurality of scan chains, wherein each scan chain connects two pads and at least one flip-flop in the chip; providing at least a selecting unit, wherein the selecting unit determines a mode according to a plurality of available scan chains after the chip is packaged; and determining a target scan chain to be connected with a target flip-flop corresponding to the selecting unit according to the mode determined by the selecting unit.

According to one embodiment of the claimed invention, a chip with an integrated circuit testing function is provided. The chip comprises: a plurality of scan chains, respectively connecting a plurality of pads in a chip, wherein each scan chain connects two pads and at least one flip-flop in the chip; at least a selecting unit, wherein the selecting unit determines a mode according to a plurality of available scan chains after the chip is packaged; and a target scan chain is determined to be connected with a target flip-flop corresponding to the selecting unit according to the mode determined by the selecting unit.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
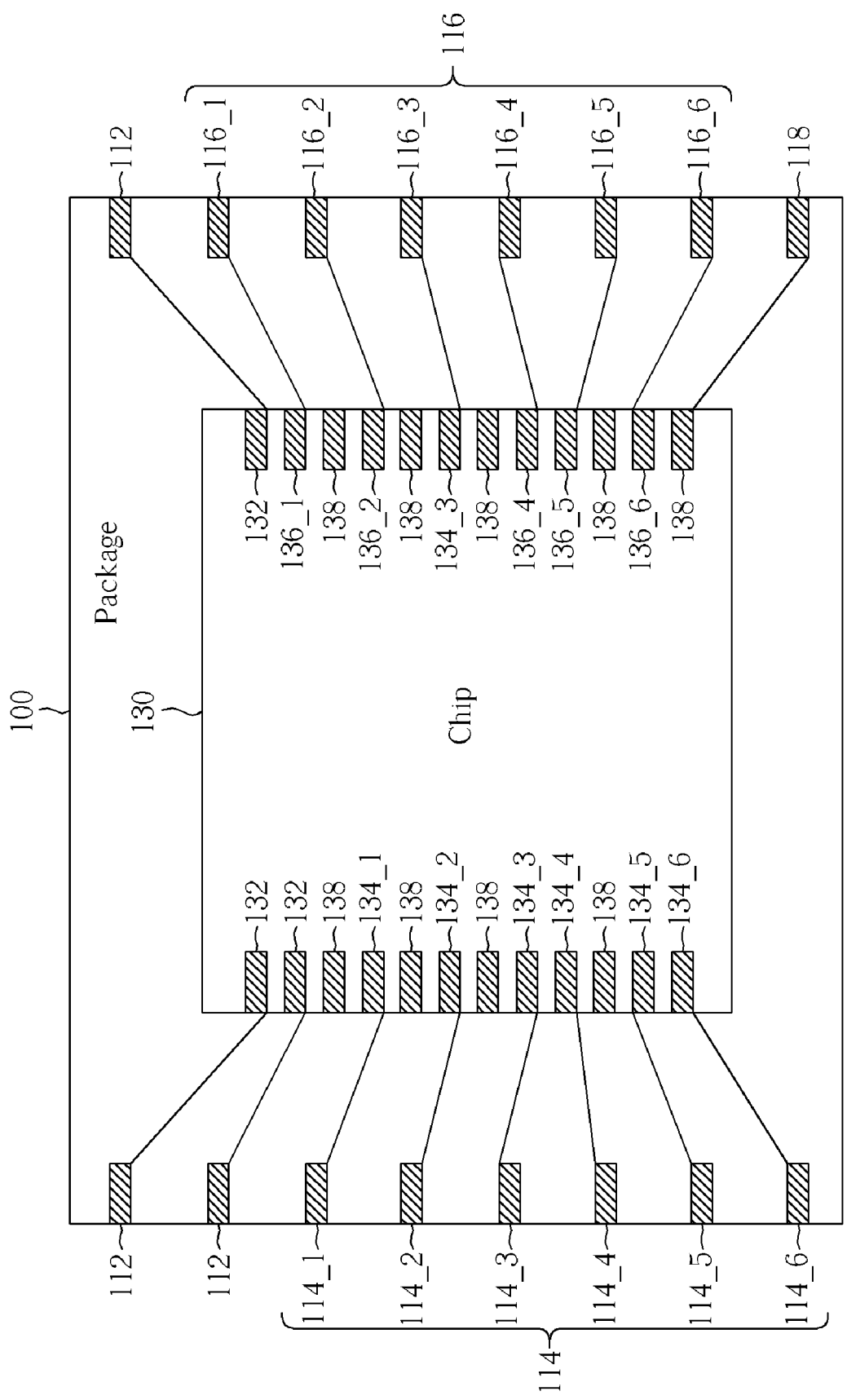
FIG. 1 is a diagram illustrating prior art functions of pads in a chip and pins in a package.
Figure 2:
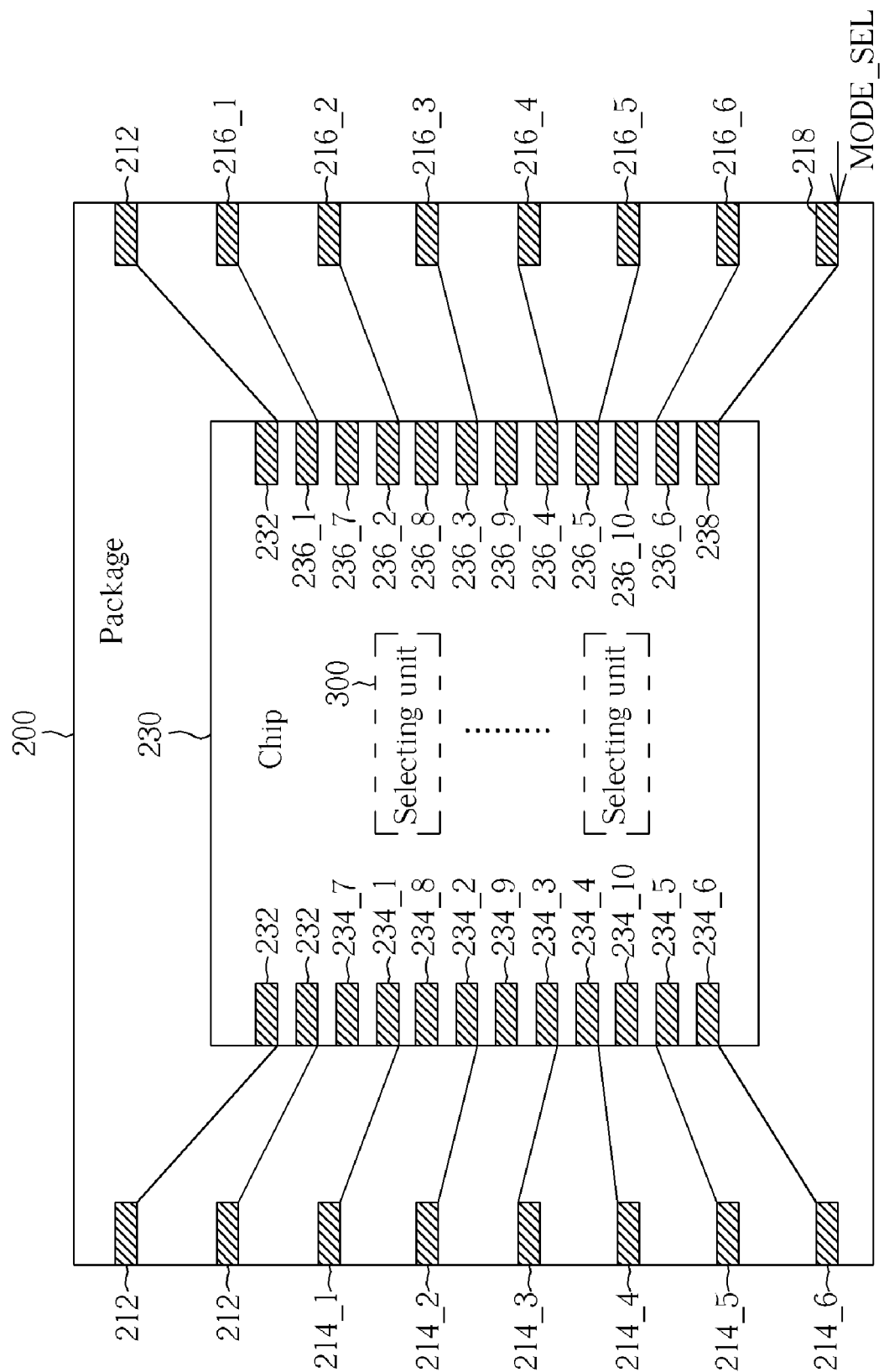
FIG. 2 is a diagram illustrating functions of pads in a chip and pins in a package according to the present invention.

Please refer to FIG. 2. FIG. 2 is the diagram illustrating functions of the pads in the chip 230 and the pins in the package 200. As shown in FIG. 2, a package 200 comprises a chip 230 and a plurality of pins. These pins include: three pins 212 for receiving controlling signals; six pins 214 for receiving scan-in signals; six pins 216 serving as scan-out nodes; and a specific pin 218 for receiving a mode selection signal MODE_SEL. The chip 230 further comprises: three pads 232 for receiving the controlling signals; ten scan-in pads 234 for receiving scan-in signals; ten scan-out pads 236 serving as scan-out nodes; and a specific pad 238 for receiving the mode selection signal MODE_SEL.

As shown in FIG. 2, each pin in the package 200 connects to its corresponding pad in the chip 230, and each scan-in pad 234 connects to its corresponding scan-out pad 236 through one or more flip-flops in the chip 230 to generate a scan chain. For example, a scan-in pad 234_1 connects through flip-flops to a scan-out pad 236_1 to generate a first scan chain; a scan-in pad 234_2 connects through flip-flops to a scan-out pad 236_2 to generate a second scan chain, etc. Therefore, in this exemplary package 200 of the present invention, ten scan chains are generated.

As shown in FIG. 2, in the test before the chip 230 is packaged, there are ten scan chains and the number of scan chains in the chip 230 is more than that in the prior art chip 130. Therefore, on average, each scan chain in the chip 230 has fewer flip-flops than the scan chain in the prior art chip 130 does, and results in shorter test time. However, because of the limitation of the number of the pins in the package 200, there are six scan chains in the chip 230 available for testing after the chip 230 is packaged. To test all the flip-flops in the chip 230, a plurality of selecting units 300 are implemented in the chip 230 for respectively determining a mode to switch the target flip-flop to a target scan chain. Further description is given below.

Figure 3:
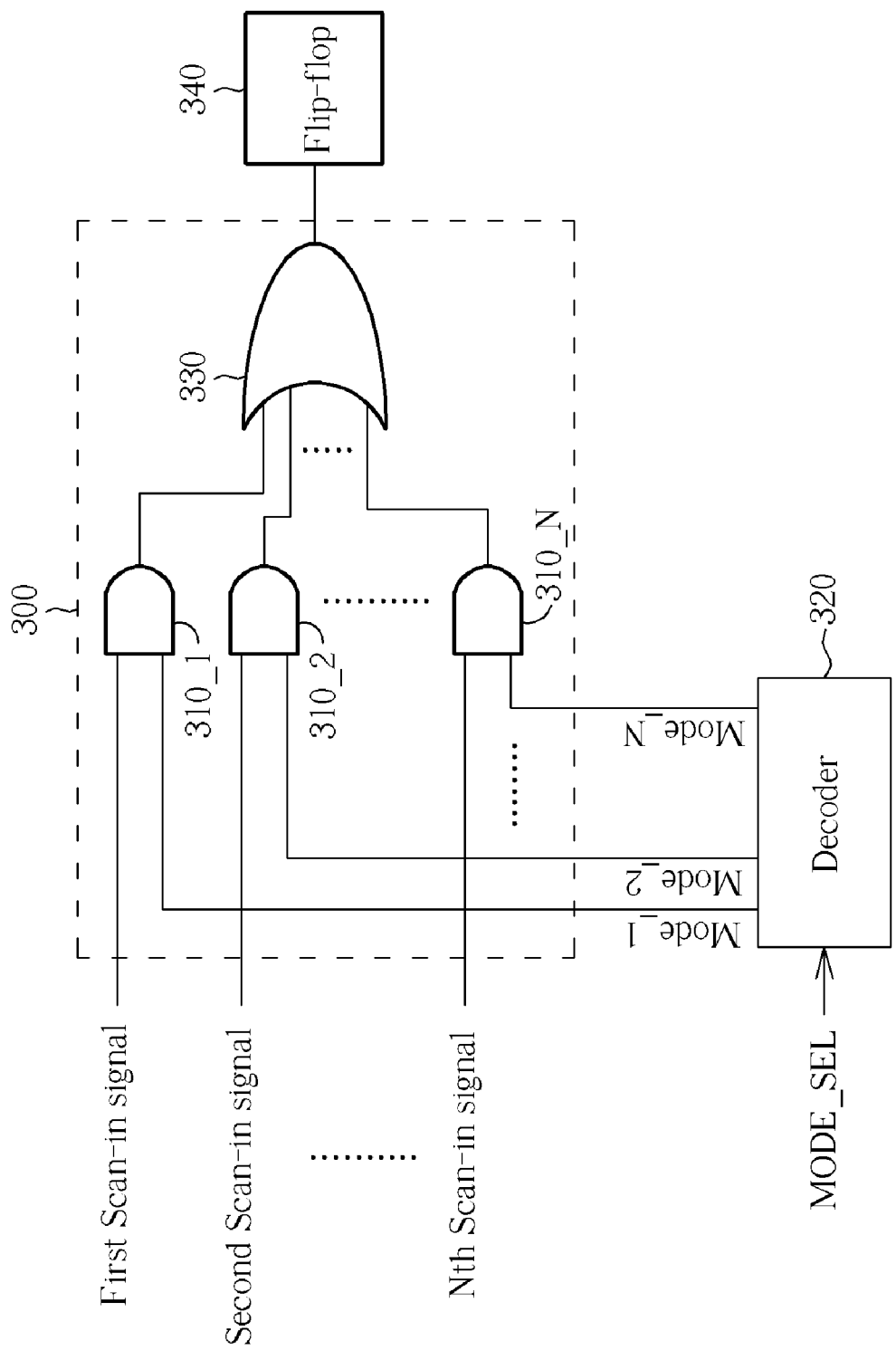
FIG. 3 is a diagram illustrating an exemplary embodiment of a selecting unit shown in FIG. 2.

Please refer to FIG. 3. FIG. 3 is a diagram illustrating an exemplary embodiment of a selecting unit 300 shown in FIG. 2. As shown in FIG. 3, the selecting unit 300 comprises, but is not limited to, a plurality of AND gates 310, where each AND gate 310 is connected to a decoder 320 and respectively connected to its corresponding scan chain; and an OR gate 330, connected to the plurality of the AND gates 310, for generating an output signal of the selecting unit 300 to a target flip-flop 340.

The functionality of the selecting unit 300 is to determine which available scan chain the target flip-flop 340 is tested by. For example, if the target flip-flop 340 is determined to be tested by the second scan chain, a second mode signal Mode_2 generated by the decoder 320 is set to be one, while other mode signals (Mode_1, Mode_3 ... Mode_N) are all set to be zero. Therefore, except for the AND gate 310_2, the outputs of the other AND gates 310 are all zero, and the output signal of the OR gate 330 (which is the output signal of the selecting unit 300), is the same as the signal on the second scan chain.

From above disclosure, the target flip-flop 340 receives the signal from a scan chain corresponding to a mode signal set by a specific logic value (e.g., '1'). That is, if the mode signal Mode_1 is set to be one, the target flip-flop 340 receives the signal from the first scan chain; if the mode signal Mode_3 is set to be one, the target flip-flop 340 receives the signal from the third scan chain. In short, the selecting unit 300 provides an electrical path linking the target flip-flop 340 and one of the available scan chains selected by a mode signal having a specific logic value.

Please note that, the number N shown in FIG. 3 is the number of scan chains in the chip 230. In the embodiment shown in FIG. 2, the number N is equal to ten, meaning that there are ten AND gates and ten mode signals. In this embodiment, the decoder 320 is implemented for determining which mode signal is set to the specific logic value "1" according to the incoming mode selection signal MODE_SEL. However, the present invention is not limited to having the decoder included in the chip. That is, the hardware configuration shown in FIG. 3 is for illustrative purposes only, and is not meant to be taken as a limitation of the present invention. For example, any logic circuit capable of bridging the target flip-flop 340 and one scan chain selected from a plurality of available scan chains can be adopted to implement the selecting unit 300.

Please note that, in the following description, a first mode indicates that the selecting unit transmits the first scan-in signal on the first scan chain to the corresponding target flip-flop; a second mode indicates that the selecting unit transmits the second scan-in signal on the second scan chain to the corresponding target flip-flop; a third mode indicates that the selecting unit transmits the third scan-in signal on the third scan chain to the corresponding target flip-flop.

Figure 4:
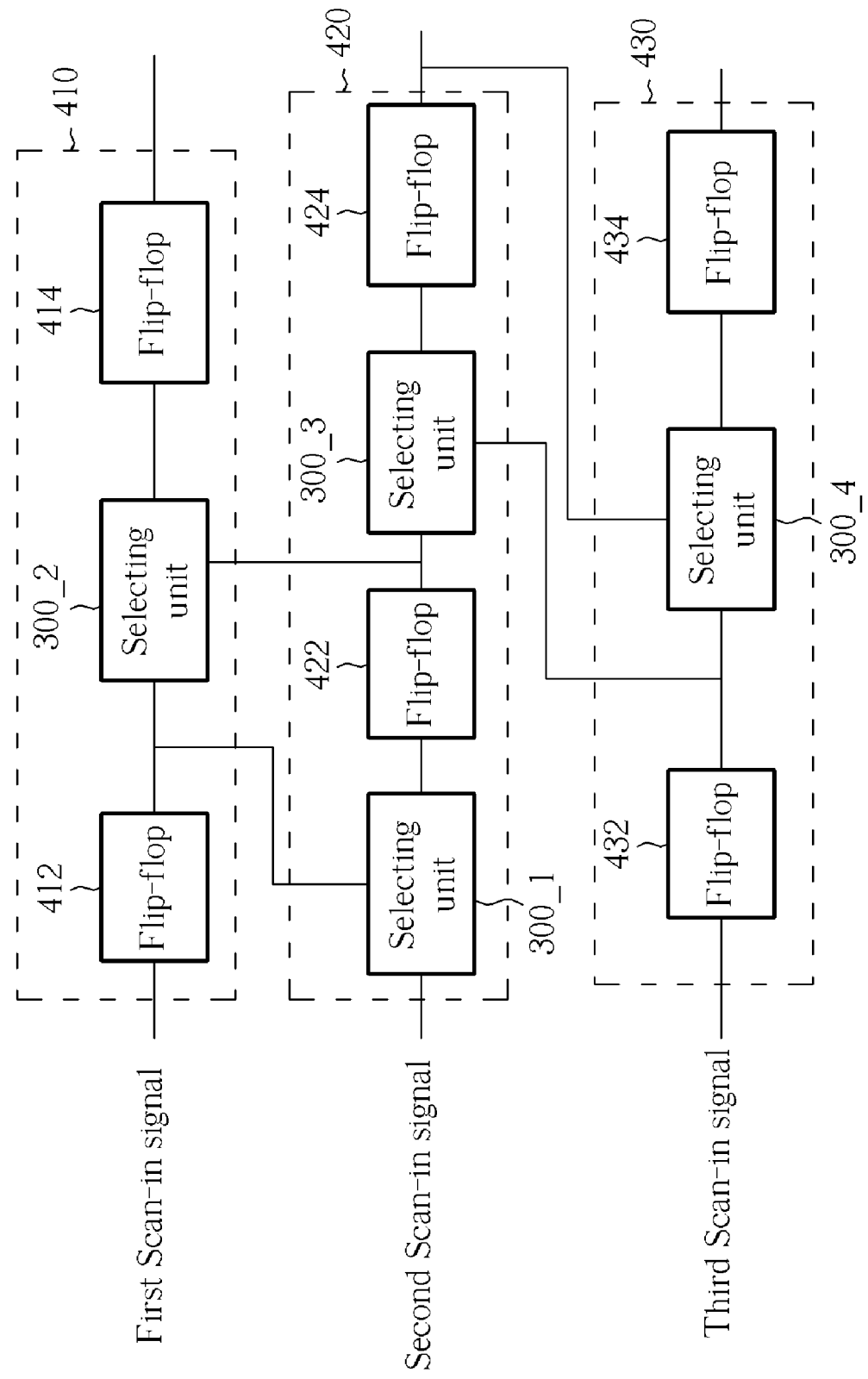
FIG. 4 is a diagram illustrating an exemplary circuit of the scan chains, flip-flops and selecting units in the chip shown in FIG. 2.

Please refer to FIG. 4. FIG. 4 is a diagram illustrating an exemplary circuit of the scan chains, flip-flops and selecting units in the chip 230 shown in FIG. 2. For simplicity, in FIG. 4, only three scan chains are shown and each scan chain comprises two flip-flops. In this exemplary circuit, a first scan chain 410 comprises two flip-flops 412 and 414; a second scan chain 420 comprises two flip-flops 422 and 424; and a third scan chain 430 comprises two flip-flops 432 and 434. Additionally, four selecting units 300_1, 300_2, 300_3, and 300_4 are connected to the input nodes of the flip-flops 422, 414, 424, and 434, respectively.

In the testing before the chip is packaged, the selecting unit 300_1 is set to be the second mode (the corresponding flip-flop 422 receives the second scan-in signal from the second scan chain 420) and the selecting unit 300_2 is set to be the first mode (the corresponding flip-flop 414 receives the signal from the first scan chain 410). Additionally, the selecting unit 300_3 is set to be the second mode (that is, the corresponding flip-flop 424 receives the second scan-in signal from the second scan chain 420) and the selecting unit 300_4 is set to be the third mode (the corresponding flip-flop 434 receives the third scan-in signal from the third scan chain 420). According to the above-mentioned mode settings of the selecting units, the first scan-in signal sequentially transmits to flip-flop 412 and 414; the second scan-in signal sequentially transmits to flip-flop 422 and 424; and the third scan-in signal sequentially transmits to flip-flop 432 and 434.

However, if the second scan chain 420 is an unavailable scan chain after the chip is packaged, the mode settings of the selecting unit 300_1, 300_2, 300_3, and 300_4 must be modified to allow the flip-flops 422 and 424 to be tested.

In the testing after the chip is packaged, the selecting unit 300_1 is set to the first mode (flip-flop 432 receives the first scan-in signal from the first scan chain 410) and the selecting unit 300_2 is set to the second mode (flip-flop 414 receives the second scan-in signal from the second scan chain 420). Additionally, the selecting unit 300_3 is set to the third mode (corresponding flip-flop 424 receives the third scan-in signal from the third scan chain 430) and the selecting unit 300_4 is set to the second mode (flip-flop 434 receives the second scan-in signal from the second scan chain 420). According to the above-mentioned mode settings, the first scan-in signal sequentially transmits to flip-flop 412, 432 and 414, and the third scan-in signal sequentially transmits to flip-flop 432, 424 and 434. Therefore, by changing the mode of each selecting unit, the target flip-flop can receive the signal from different scan chains.

It is known that in the prior art integrated circuit testing method, whether the testing is performed before or after the chip is packaged, only two scan chains 410 and 430 are used to perform testing and each scan chain has three flip-flops. However, according to the embodiment of present invention, when the testing is performed before the chip is packaged or the testing is performed after the chip is packaged by a package with more pins, additional scan chain 420 is added and each scan chain has two flip-flops. Therefore the length of the scan chain is indeed reduced and testing costs are also reduced.

Please note that, the number of scan chains and the flip-flops, and the positions of the selecting units shown in FIG. 4 are for illustrative purposes only. Without departing from the spirit of the present invention, the number of scan chains and the flip-flops and the positions of the selecting units can be determined by the designer's consideration. These alternative designs all fall in the scope of the present invention.

Please note that, in the embodiment of the present invention, all the pads that are available for testing are used to generate scan chains. However, the present invention is not limited by this scope. As the number of available scan chains before the chip is packaged is greater than the number of available scan chains after the chip is packaged, any methods using the selecting units to switch the different scan-in signals on the different scan chains are all in the scope of the present invention.

Those skilled in the art will readily observe that numerous modifications and alterations of the device and method may be made while retaining the teachings of the invention.

What is claimed is:

1. An integrated circuit testing method, comprising:
   connecting a plurality of pads in a chip to respectively generate a plurality of scan chains, wherein the plurality of scan chains include at least a first scan chain and a second scan chain, the first scan chain connects a first scan-in pad, a first scan-out pad and at least a first flip-flop, and the second scan chain connects a second scan-in pad, a second scan-out pad and at least a second flip-flop;
   providing at least a selecting unit;
   if the second scan-in pad does not connect to a pin of a package when the chip is packaged, the selecting unit selecting a first scan-in signal from the first scan chain and transmits the first scan-in signal to the second flip-flop; and
   if the second scan-in pad connects to a pin of the package when the chip is packaged, the selecting unit selecting a second scan-in signal from the second scan chain and transmits the second scan-in signal to the second flip-flop.

2. The method of claim 1, wherein the plurality of scan chains corresponds to all pads in the chip that are available for testing the chip.

3. The method of claim 1, further comprising:
   inputting a mode selection signal to a specific pad in the chip that is unavailable for testing the chip, for controlling the selecting unit to selectively transmit the first scan-in signal or the second scan-in signal to the second flip-flip.

4. A chip with an integrated circuit testing function, comprising:
   a plurality of scan chains, connected to a plurality of pads in a chip, respectively, wherein the plurality of scan chains include at least a first scan chain and a second scan chain, the first scan chain connects a first scan-in pad, a first scan-out pad and at least a first flip-flop, and the second scan chain connects a second scan-in pad, a second scan-out pad and at least a second flip-flop; and
   at least a selecting unit;
   wherein if the second scan-in pad does not connect to a pin of a package when the chip is packaged, the selecting unit selects a first scan-in signal from the first scan chain and transmits the first scan-in signal to the second flip-flop; and
   wherein if the second scan-in pad connects to a pin of the package when the chip is packaged, the selecting unit selects a second scan-in signal from the second scan-in pad and transmits the second scan-in signal to the second flip-flop.

5. The chip of claim 4, wherein the plurality of scan chains correspond to all pads in the chip that are available for testing the chip.

6. The chip of claim 4, further comprising:
   a specific pad, positioned in the chip that is unavailable for testing the chip, for receiving a mode selection signal for controlling the selecting unit to selectively transmit the first scan-in signal or the second scan-in signal to the second flip-flip.

* * * * *